United States Patent
Troy et al.

(10) Patent No.: US 6,707,407 B2
(45) Date of Patent: Mar. 16, 2004

(54) METHOD FOR CONVERTING A VIDEO SIGNAL FROM ONE OF AN ANALOGUE AND DIGITAL FORM TO THE OTHER OF THE ANALOGUE AND DIGITAL FORM WITH ENHANCED SIGNAL TO NOISE RATIO

(75) Inventors: Vincent J. Troy, Limerick (IE); Anthony Scanlan, Dooradoyle (IE); Joseph Michael Barry, Rossbrien (IE); John Patrick Purcell, Dooradoyle (IE); Martin Gerard Cotter, Ennis (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/166,927

(22) Filed: Jun. 11, 2002

(65) Prior Publication Data

US 2003/0052805 A1 Mar. 20, 2003

Related U.S. Application Data

(60) Provisional application No. 60/297,383, filed on Jun. 11, 2001.

(51) Int. Cl.[7] .................................................. H03M 3/00
(52) U.S. Cl. .......................................... 341/143; 341/144
(58) Field of Search ................................ 341/143, 144, 341/120

(56) References Cited

U.S. PATENT DOCUMENTS 5,305,004 A * 4/1994 Fattaruso .................... 341/120
5,396,244 A * 3/1995 Engel ......................... 341/143

* cited by examiner

Primary Examiner—Brian Young
Assistant Examiner—Joseph Lauture
(74) Attorney, Agent, or Firm—Iandiorio & Teska

(57) ABSTRACT

A method for converting multi-bit digital video data signals to analogue form wherein the video data signals are in three formats, namely, standard definition, progressive scan and high definition formats, which permits a relatively low order analogue reconstruction filter to be used for filtering the analogue form of the signal. The three formats of the digital video data signals are over-sampled at relatively low over-sampling rates, the standard definition video signals being over-sampled at eight times the nyquist sampling frequency, the progressive scan format signals being over-sampled at four times the nyquist sampling frequency, while the high definition format signals are over-sampled at twice the nyquist sampling frequency. By virtue of the fact that the Video data signals are over-sampled at relatively low over-sampling rates, the over-sampled signals are subjected to sigma-delta modulation in a relatively low order sigma-delta modulator, namely, a second order sigma-delta modulator for noise shaping the quantisation noise. This, thus, permits the analogue reconstruction filter to be provided as a third order filter, and thus of relatively low order.

13 Claims, 4 Drawing Sheets

METHOD FOR CONVERTING A VIDEO SIGNAL FROM ONE OF AN ANALOGUE AND DIGITAL FORM TO THE OTHER OF THE ANALOGUE AND DIGITAL FORM WITH ENHANCED SIGNAL TO NOISE RATIO

This application claims the benefit of provisional No. 60/297,383 filed on Jun. 11, 2001.

FIELD OF THE INVENTION

The invention relates to a method for converting a video signal in one of an analogue and digital form to the other of the analogue and digital form with enhanced signal to noise ratio, so that a relatively low order analogue filter is suitable for filtering the analogue form of the signal.

BACKGROUND TO THE INVENTION

In the conversion of video signals from digital form to analogue form because of the relatively wide band width of video signals, it is desirable that the analogue reconstruction filter be of the lowest possible order while at the same time providing a good quality analogue video signal. Analogue reconstruction filters of relatively high order tend to be complex and thus relatively expensive, particularly when the band width of the signal is relatively wide. Video signals, in general, are required in three formats, namely, standard definition format, progressive scan format and high definition format. The band width of the video signals in the three formats range from 6 MHz for standard definition format to 30 MHz for high definition format. Progressive scan format signals are of band width of 12 MHz. These band widths of video signals are relatively high, particularly when compared with audio signals which are of band width in the KHz range.

In order to convert such audio signals from digital form to analogue form and to provide the analogue form with an acceptable signal to noise ratio, it is known to over-sample the digital form of such audio signals at high over-sampling rates of the order of one hundred and twenty times the nyquist sampling frequency. In order to achieve a desired signal to noise ratio at such high over-sampling rates, the over-sampled signals are subjected to sigma-delta modulation in a sigma-delta modulator for noise shaping quantisation noise resulting from over-sampling the signals. Because of the high over-sampling rate the sigma-delta modulator must be of relatively high order, which may be as high as seventh order. However, because of the relatively narrow band width of such signals, the output of the sigma-delta modulator may be a single bit output, which thus requires that the digital to analogue converter (DAC) need similarly be only a single bit DAC. The analogue reconstruction filter, however, must be one order higher than the order of the sigma-delta modulator, in order to cancel the shaped quantisation noise. While in the case of audio signals a relatively high order analogue reconstruction filter is required where the audio signal is subjected to sigma-delta modulation of relatively high order, since the band width of the audio signal is relatively narrow, such a high order reconstruction filter can be tolerated. In general, the complexity and cost of such reconstruction filters of the appropriate order is relatively low due to the narrow band width of the signals. However, because of the wide band width of video signals, an analogue reconstruction filter of such high order would be entirely unacceptable.

There is therefore a need for a method for converting a video signal in digital form to analogue fort which permits the use of a relatively low order analogue reconstruction filter, and indeed, there is also a need for a method for converting video signals in either one of an analogue and digital form to the other of the analogue and digital form which likewise permits the use of a relatively low order analogue filter.

The present invention is directed towards providing such a method.

SUMMARY OF THE INVENTION

According to the invention there is provided a method for converting a video signal in one of an analogue and digital form to the other of the analogue and digital form, the video signal in the digital form being a multi-bit signal, the method comprising the steps of:

over-sampling the video signal at a low over-sampling rate, subjecting the over-sampled video signal to sigma-delta modulation in a sigma-delta modulator of low order for noise shaping the over-sampled signal for enhancing the signal to noise ratio of the video signal, and filtering the analogue form of the video signal in an analogue filter of one order greater than the order of the sigma-delta modulator.

Preferably, the order of the sigma-delta modulator does not exceed four. Advantageously, the order of the sigma-delta modulator does not exceed three. Ideally, the sigma-delta modulator is a second order sigma-delta modulator.

In one embodiment of the invention the sigma-delta modulation of the over-sampled video signal is carried out in a multi-bit sigma-delta modulator.

In another embodiment of the invention the over-sampling rate at which the video signal is over-sampled does not exceed eight times the nyquist sampling frequency.

In one embodiment of the invention the video signal is in standard definition format and the over-sampling rate is eight times the nyquist sampling frequency.

In another embodiment of the invention the video signal is in progressive scan format and the over-sampling rate is four times the nyquist sampling frequency.

In a further embodiment of the invention the video signal is in high definition format and the over-sampling rate is twice the nyquist sampling frequency.

In one embodiment of the invention the video signal after being over-sampled is at least an eight bit signal.

In another embodiment of the invention the video signal after being over-sampled is at least a ten bit signal.

In a further embodiment of the invention the video signal after being over-sampled is at least a twelve bit signal, while in a still further embodiment of the invention the video signal after being over-sampled is at least a fourteen bit signal.

In another embodiment of the invention the noise shaped signal after sigma-delta modulation is subjected to bit shuffling for minimising mismatch noise generated in the conversion of the signal from one of the analogue and digital forms to the other of the analogue and digital forms.

In one embodiment of the invention the video signal is a digital video signal, and is converted to analogue form.

In another embodiment of the invention the analogue filter is a reconstruction filter.

Advantages of the Invention

The advantages of the invention are many. A particularly important advantage of the invention is that the method according to the invention for converting video signals in one of analogue and digital form to the other of analogue and digital form permits the use of a relatively low order analogue filter for filtering the analogue form of the signals. When the method is used for converting digital video data signals to analogue form, a relatively low order Butterworth analogue reconstruction filter can be used, and typically, the analogue reconstruction filter can be a third or fourth order filter. This allows a relatively simple and inexpensive analogue reconstruction filter to be used. A particularly important advantage of being able to use a relatively low order analogue reconstruction filter is that in general, a low order reconstruction filter gives a more linear phase response, which is important for the quality of video signals.

When the method according to the invention is applied to the conversion of video signals in analogue form to digital form, similar advantages arise in that an analogue anti-aliasing filter for filtering the analogue form of the signal can likewise be provided as a relatively low order filter, typically, a third or fourth order filter, thus permitting the use of a relatively simple and inexpensive analogue filter.

These advantages and others will be readily apparent to those skilled in the art from the following description of some embodiments of the invention, which are given by way of example only, with reference to the accompanying drawings.

BRIEF DESCRIPTION OF THE DRAWINGS

FIG. 5 is a block representation of a digital to analogue converting circuit for converting video signals in digital form to analogue form using a method according to another embodiment of the invention.

DETAILED DESCRIPTION OF PREFERRED EMBODIMENTS OF THE INVENTION

Figure 1:
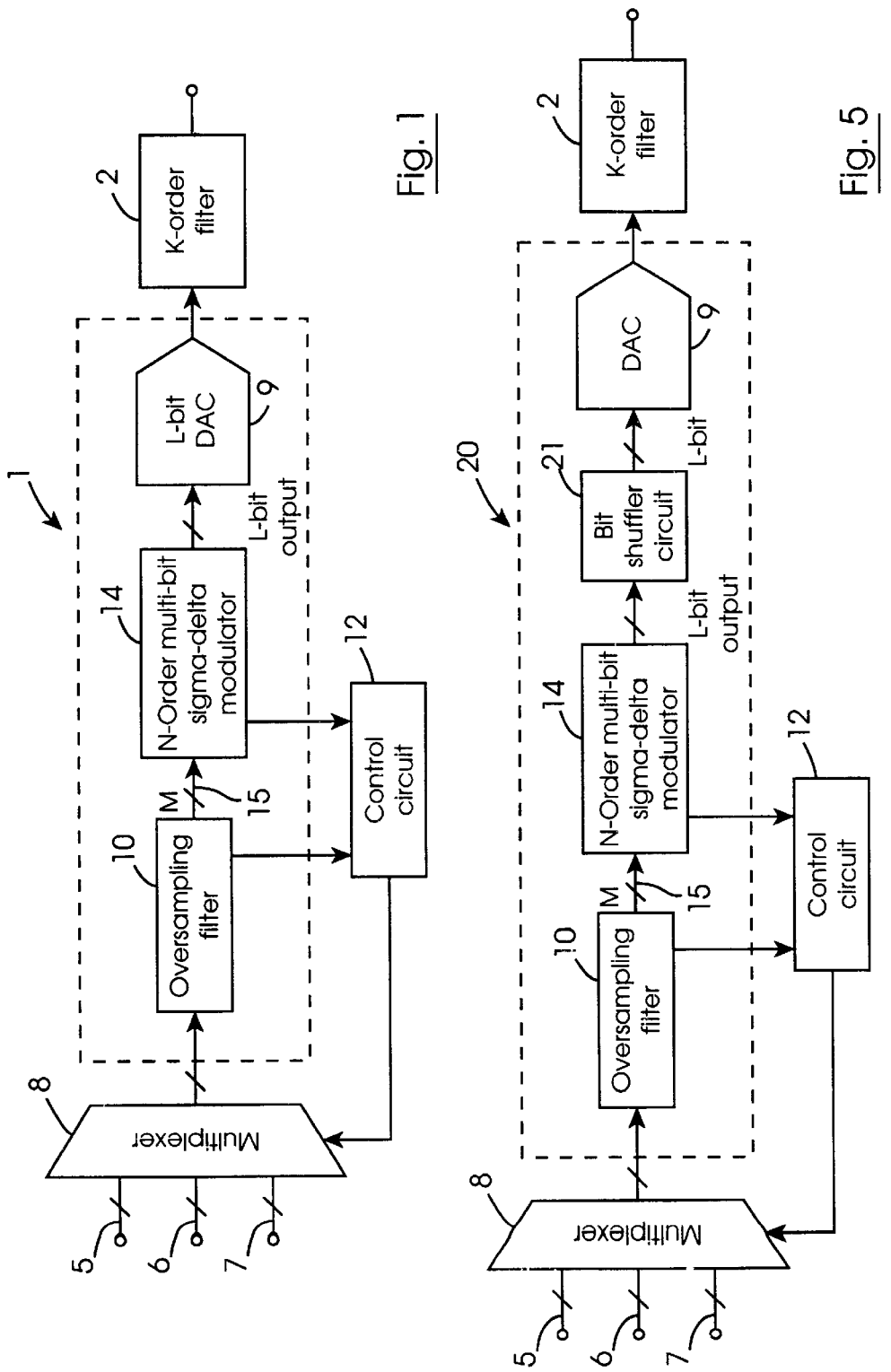
FIG. 1 is a block representation of a digital to analogue converting circuit for converting video signals in digital form to analogue form using a method according to the invention.

A first embodiment of the method according to the invention for converting digital video data signals to analogue signals will be described with reference to FIGS. 1 and 2. In the method according to the invention multi-bit digital video data signals in three formats, namely, standard definition, progressive scan and high definition formats are converted to analogue form in a digital to analogue converting circuit indicated generally by the reference numeral 1 in FIG. 1. The converted video signals in analogue form are passed through a K-order analogue reconstruction filter 2. In this embodiment of the invention video signals in the three formats are converted in the same converting circuit 1 and are filtered in the same reconstruction filter 2. However, since the video signals in each of the three formats can have up to three channels, a separate digital to analogue converting circuit 1 and a corresponding separate analogue reconstruction filter 2 is provided for each channel. However the same analogue to digital converting circuit 1 and the same analogue reconstruction filter 2 are used for each of the three format signals in each channel. Only one digital to analogue converting circuit is described, however, the other two digital to analogue converting circuits for the other two channels are identical.

Digital video data signals in the three formats, namely, standard definition, progressive scan and high definition are applied to the circuit 1 on first, second and third buses, 5, 6 and 7, respectively, the standard definition video data signals being applied to the first bus 5 the progressive scan video data signals being applied to the second bus 6 and the high definition video data signals being applied to the third bus 7. A multiplexer 8 selectively and sequentially multiplexes the video data signals in the three formats to the circuit 1. An L-bit digital to analogue converter (DAC) 9 in the circuit 1 converts the digital video data signals to analogue form and outputs the analogue video signals to the reconstruction filter 2.

The digital video data signals received in the circuit 1 from the multiplexer 8 are initially subjected to over-sampling in an over-sampling filter 10. The digital video data signals in the three formats are over-sampled at over-sampling rates sufficient to displace image frequencies resulting from zero hold characteristics of the DAC 9 a sufficient distance from the widest band width video signal so that the same analogue reconstruction filter 2 can be used for filtering the analogue form of the three signals.

In this embodiment of the invention the standard definition format video signals are over-sampled at eight times the nyquist sampling frequency, and thus are over-sampled at an over-sampling frequency of 108 MHz. The progressive scan format signals are over-sampled at four times the nyquist sampling frequency, and are similarly over-sampled at a frequency of 108 MHz. The high definition format video signals are over-sampled at a rate of twice the nyquist sampling frequency, and are thus over-sampled at a frequency of 148.5 MHz. Thus, the image frequencies of the standard definition and progressive scan format video signals are displaced to a frequency of 108 MHz, and multiples thereof, while the image frequency of the high definition format video signals is displaced to 148.5 MHz and multiples thereof. The widest band width signal is the high definition format signal at 30 MHz, and the closest frequency image is that of the progressive scan format signal, which at 108 MHz leaves a band gap of approximately 66 MHz between the frequency image of the progressive scan signal and the band width of the high definition signal. This is thus sufficient for permitting the analogue reconstruction filter 2 to be provided with a band pass of 30 MHz and a relatively low roll-off rate of attenuation, so that the same reconstruction filter 2 can be used for all the formats of the video signals.

A control circuit 12 controls the multiplexer 8 for sequentially selecting the video signals on the input buses 5, 6 and 7 in the appropriate sequence, and controls the over-sampling filter 10 for over-sampling the signals in the respective format at the appropriate over-sampling frequencies.

The over-sampled signals from the over-sampling filter 10 are subjected to sigma-delta modulation in an N-order sigma-delta modulator 14, which is a low order modulator, in this embodiment of the invention a second order sigma-delta modulator, for noise shaping the quantisation noise from the over-sampling filter 10 in order to improve the signal to noise ratio of the digital video data signals. The noise shaped digital video data signals are then converted in the DAC 9 to analogue form.

The over-sampled signals are outputted from the over-sampling filter 10 on an M-bit bus 15 which in this embodiment of the invention is a fourteen bit bus. The output of the sigma-delta modulator is an L-bit output which in this embodiment of the invention is an eleven bit output, and thus, the DAC 9 is an eleven bit DAC. However, it will be readily apparent to those skilled in the art that the output of the over-sampling filter 10 may be of any desired bit size and typically, would be of bit size in the order of eight bits upwards. Similarly, the output of the sigma-delta modulator may be of any bit size from eight bits upwards.

By selecting the order of the sigma-delta modulator to be relatively low, in this case a second order sigma-delta modulator, the order of the analogue reconstruction filter can similarly be provided as a relatively low order filter of one order greater than that of the sigma-delta modulator. Thus, in this embodiment of the invention the analogue reconstruction filter 2 is a third order filter, namely, one order greater than the order of the sigma-delta modulator 10 in order to remove noise introduced by the sigma-delta modulator 14.

The invention essentially resides in the discovery that at relatively low over-sampling frequencies, typically, up to sixteen times the nyquist sampling rate, adequate quantisation noise shaping can be achieved by a relatively low order sigma-delta modulator. Thus, by discovering the fact that a low order sigma-delta modulator provides adequate noise shaping of quantisation noise introduced by an over-sampling filter where the over-sampling filter is operating at relatively low over-sampling rates thus, in turn permits the use of a relatively low order analogue reconstruction filter.

Figure 2:
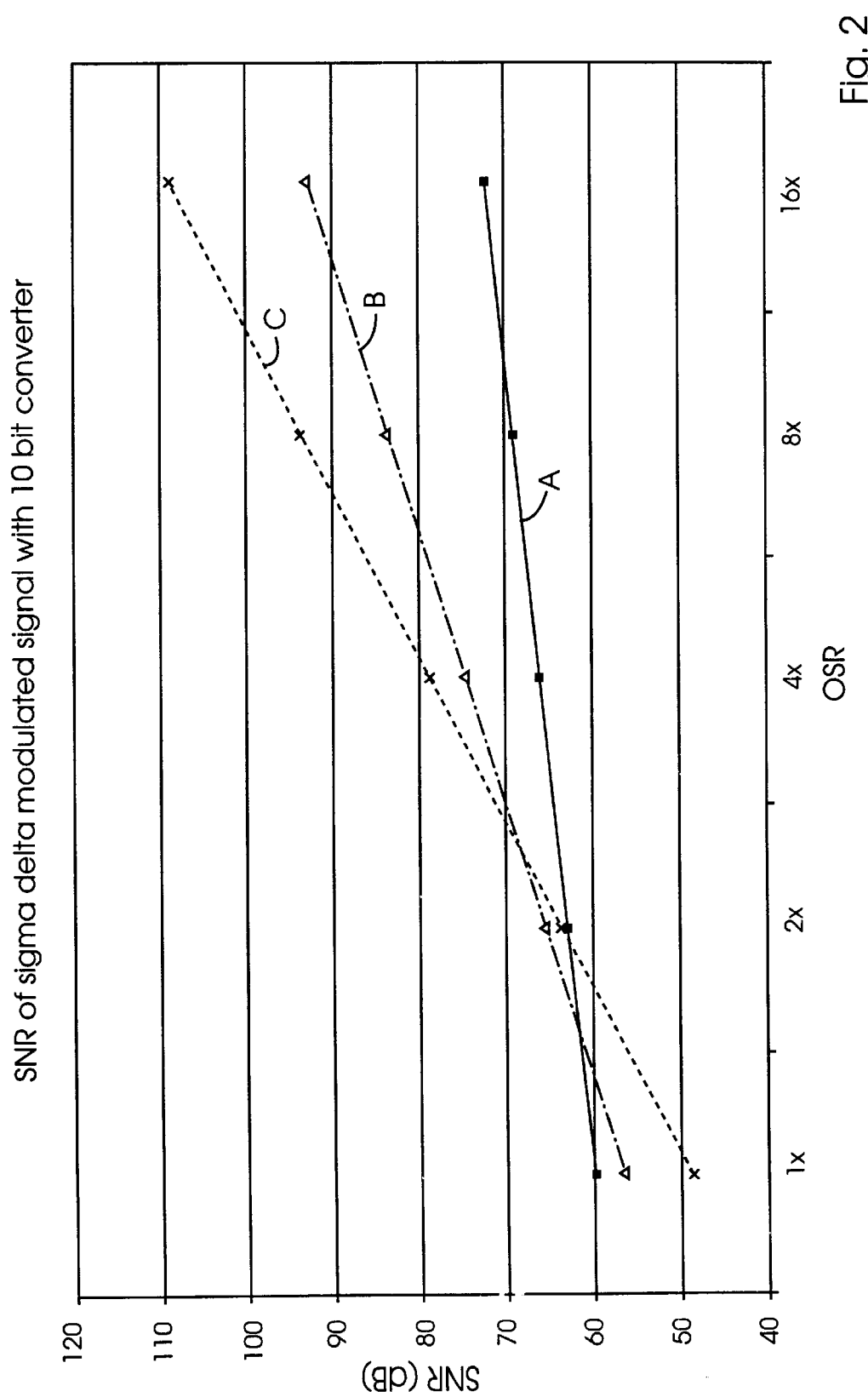
FIG. 2 is a graphical representation of a plot of signal to noise ratio against over-sampling rates for zero order, first order and second order sigma-delta modulation in a ten bit DAC.

Referring in particular to FIG. 2, three graphs of signal to noise ratio plotted against over-sampling rates resulting from sigma-delta modulation of zero order, first and second order are illustrated. Graph A is a plot of signal to noise ratio against over-sampling rates for zero order sigma-delta modulation with a ten bit converter, while graphs B and C are corresponding plots for first and second order sigma-delta modulation, respectively. The signal to noise ratio is expressed in decibels, while the over-sampling rates are expressed in multiples of the nyquist sampling frequencies. From the three graphs A, B and C it can be seen that at over-sampling rates of twice the nyquist sampling frequency there is little or no difference in the signal to noise ratio achieved by using different orders of sigma-delta modulation. Indeed, first order sigma-delta modulation gives slightly better signal to noise ratio performance than either zero order or second order. At four times the nyquist sampling frequency the difference between the signal to noise ratio achieved by first and second order sigma-delta modulation is only marginal. First order sigma-delta modulation provides a signal to noise ratio of approximately 75 db, while second order sigma-delta modulation provides a signal to noise ratio of 78 db approximately. At over-sampling rates of eight times the nyquist sampling frequency the difference between first order and second order sigma-delta modulation is likewise only marginal. First order sigma-delta modulation provides a signal to noise ratio of 84 db approximately, while second order sigma-delta modulation provides a signal to noise ratio of 94 db approximately. Thus, by discovering that low order sigma-delta modulation provides noise shaping of the quantisation noise with adequate signal to noise ratio for low over-sampling rates, and using such low order sigma-delta modulation, the order of the analogue reconstruction filter can likewise be provided as a relatively low order filter, being one order greater than the order of the sigma-delta modulator.

Figure 3:
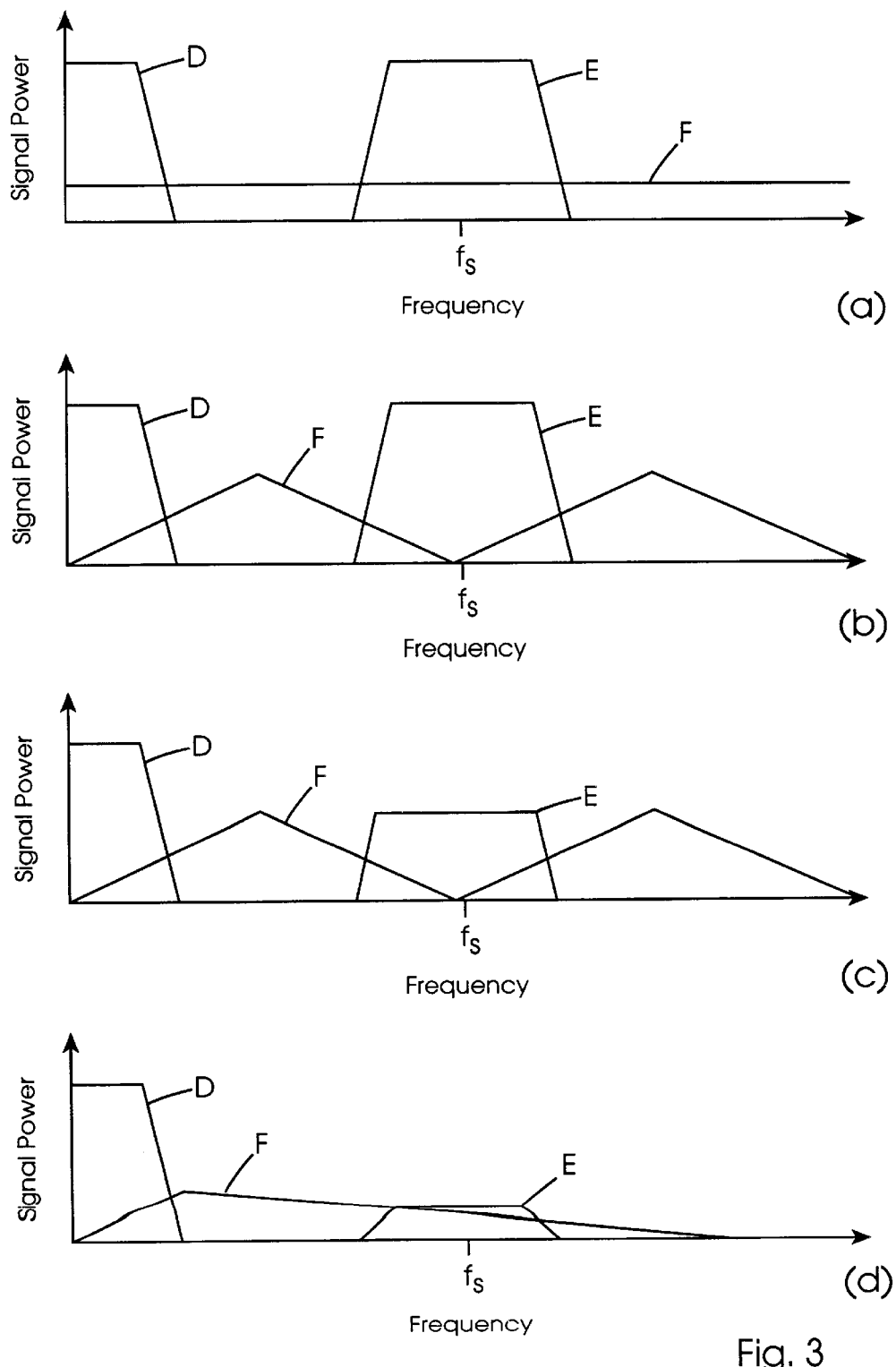
FIGS. 3(a) to (d) are waveforms of signals and noise in the converting circuit of FIG. 1.

Referring now to FIGS. 3(*a*) to (*d*), each of the FIGS. 3(*a*) to (*d*) illustrates plots of signal power against frequency for the video data signals of any one of the three formats at different stages of the conversion circuit. In each of the FIGS. 3(*a*) to (*d*) the curve D represents the band width of the video signal. The curve E represents the image frequency of the video signal at the over-sampling frequency $f_g$. The curve F represents the quantisation noise resulting from the over-sampling filter 10. The curves D, E and F of FIG. 3(*a*) illustrate the video signal band width, image frequency and quantisation noise, respectively, after over-sampling, in other words, at the output of the over-sampling filter 10. The curves D, E and F of FIG. 3(*b*) illustrate the band width of the video signal, the image frequency and the quantisation noise, respectively, after the sigma-delta modulator 14. The quantisation noise, as can be seen, has been noise shaped by the sigma-delta modulator 14. The curves D, E and F of FIG. 3(*c*) illustrate the band width of the video signal, the image frequency and the quantisation noise, respectively, after the DAC 9 and as can be seen, the image frequency at the sampling frequency has been attenuated by the DAC 9. The curves D, E and F of FIG. 3(*d*) illustrate the band width of the video signal, the remaining image frequency and the remaining quantisation noise after the analogue video signal has been passed through the analogue reconstruction filter 2.

Accordingly, as can be seen, the combination of the low order sigma-delta modulator and the low order analogue reconstruction filter provide an analogue signal of good signal to noise ratio. The narrower the band width of the video signal, the better is the signal to noise ratio as will be apparent from FIG. 3(*d*), and since the standard definition video data signal is of 6 MHz band width while the high definition video data signal is of 30 MHz band width, the signal to noise ratio is best in the standard definition video data signal, although it is quite acceptable in the widest video signal, namely, the high definition format signal, because of the multi-bit conversion.

Figure 4:
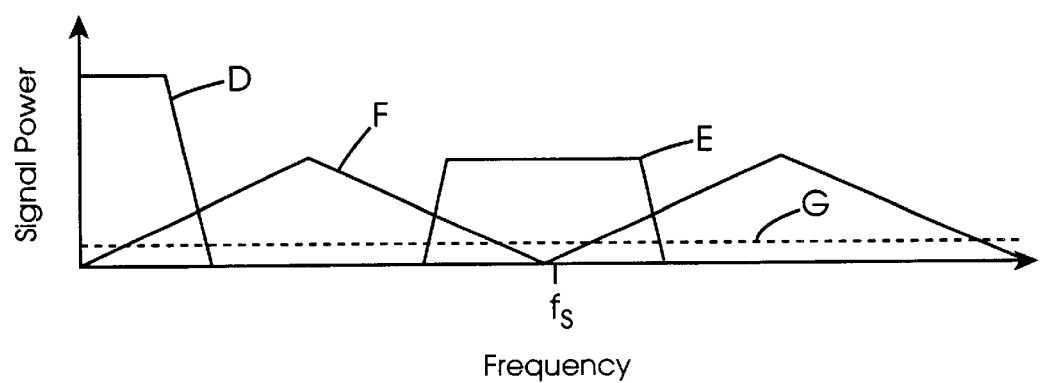
FIG. 4 is waveforms of signals and noise corresponding to FIG. 3(c) when a DAC of the converting circuit of FIG. 1 is an imperfect DAC.

Referring now to FIG. 4, FIG. 4 illustrates curves D, E and F which are similar to those illustrated in FIG. 3(*c*), in that the curves D, E and F illustrate the video signal band width, the image frequency and the quantisation noise in the signal after the DAC 9. However, in addition to the curves D, E and F, an additional curve G, which is a straight line, illustrates mismatch noise which would be introduced by the DAC 9 if the DAC 9 were not a perfect DAC. However, most DACs do introduce some mismatch noise. This mismatch noise can be reduced by bit shuffling which is carried out prior to the sigma-delta modulated signal being clocked to the DAC.

FIG. 5 illustrates a digital to analogue converting circuit 20 for carrying out the method according to another embodiment of the invention which includes bit shuffling. The digital to analogue converting circuit 20 of FIG. 5 is essentially similar to that of the circuit 1 of FIG. 1 and similar components are identified by the same reference numerals. The only difference between the digital to analogue converting circuit 20 and the digital to analogue converting circuit 1 is that a bit shuffler circuit 21 is interposed between the sigma-delta modulator 14 and the DAC 9. By introducing the bit shuffler circuit 21, the mismatch noise introduced by the DAC 9 can be effectively eliminated. Such bit shuffler circuits will be well known to those skilled in the art.

While the over-sampling filter and the sigma-delta modulator have not been described in detail, such over-sampling filters and sigma-delta modulators will be well known to those skilled in the art. Additionally, the DAC may be any suitable type of DAC, for example, a current DAC or a voltage DAC, and such DACs will be well known to those skilled in the art. The analogue reconstruction filter 2 is a Butterworth filter and as discussed above is a third order Butterworth filter.

While the method according to the invention has been described for converting video signals in digital form to analogue form, it will be readily apparent to those skilled in the art that the method can be applied to the conversion of video signals in analogue form to digital form, and similar advantages will be achieved in that a relatively low order analogue anti-aliasing filter can be used.

What is claimed is:

1. A method for selectively converting a video signal in any one of standard definition format, Progressive scan format and high definition format from digital form to analogue form in a digital to analogue converting circuit having a digital to analogue converter and an analogue reconstruction filter, the digital video signal being in multi-bit form, the method comprising the steps of:

over-sampling the video signal in digital form to produce an over-sampled digital signal of at least eight bits, the video signal being over-sampled at a low over-sampling rate sufficient to displace image frequencies in the analogue form of the video signal resulting from zero hold characteristics of the digital to analogue converter a sufficient frequency distance from the frequency bandwidth of the video signal of the widest frequency bandwidth of the video signals of the standard definition, progressive scan and high definition formats so that the analogue reconstruction filter can be used for filtering the analogue form of video signals in each one of the standard definition, progressive scan and high definition formats, subjecting the over-sampled video signal to sigma-delta modulation in a sigma-delta modulator of low order for noise shaping the over-sampled video signal for enhancing the signal to noise ratio of the video signal, converting the sigma-delta modulated video signal to the analogue form in the digital to analogue converter, and filtering the analogue form of the video signal in an analogue reconstruction filter, the analogue reconstruction filter being of one order greater than the order of the sigma-delta modulator.

2. A method as claimed in claim 1 in which the order of the sigma-delta modulator does not exceed four.

3. A method as claimed in claim 1 in which the order of the sigma-delta modulator does not exceed three.

4. A method as claimed in claim 1 in which the sigma-delta modulator is a second order sigma-delta modulator.

5. A method as claimed in claim 1 in which the sigma-delta modulation of the over-sampled video signal is carried out in a multi-bit sigma-delta modulator.

6. A method as claimed in claim 1 in which the over-sampling rate at which the video signal is over-sampled does not exceed eight times the nyquist sampling frequency.

7. A method as claimed in claim 1 in which the video signal when in standard definition format is over-sampled at a rate which is eight times the nyquist sampling frequency.

8. A method as claimed in claim 1 in which the video signal is when in progressive scan format and the over sampling is over-sampled at a rate which is four times the nyquist sampling frequency.

9. A method as claimed in claim 1 in which the video signal when in high definition format is over-sampled at a rate which is twice the nyquist sampling frequency.

10. A method as claimed in claim 1 in which the video signal after being over-sampled is at least a ten bit signal.

11. A method as claimed in claim 1 in which the video signal after being over-sampled is at least a twelve bit signal.

12. A method as claimed in claim 1 in which the video signal after being over-sampled is at least a fourteen bit signal.

13. A method as claimed in claim 1 in which the noise shaped signal after sigma-delta modulation is subjected to bit shuffling for minimising mismatch noise generated in the conversion of the signal from the digital forms to the analogue forms.

* * * * *